(12) United States Patent
Cohen

(10) Patent No.: US 7,352,627 B2
(45) Date of Patent: Apr. 1, 2008

(54) METHOD, SYSTEM, AND CIRCUIT FOR OPERATING A NON-VOLATILE MEMORY ARRAY

(75) Inventor: Guy Cohen, Yaad (IL)

(73) Assignee: Saifon Semiconductors Ltd., Netanya (IL)

(*) Notice: Subject to any disclaimer, the term of this patent is extended or adjusted under 35 U.S.C. 154(b) by 129 days.

(21) Appl. No.: 11/324,718

(22) Filed: Jan. 3, 2006

(65) Prior Publication Data
US 2007/0153575 A1    Jul. 5, 2007

(51) Int. Cl.
G11C 16/06 (2006.01)

(52) U.S. Cl. .............. 365/185.2; 365/185.03; 365/210

(58) Field of Classification Search .......... 365/185.2, 365/185.03, 201, 210, 189.09
See application file for complete search history.

(56) References Cited

U.S. PATENT DOCUMENTS

| | | | |
|---|---|---|---|
| 3,881,180 A | 4/1975 | Gosney, Jr. | |
| 3,895,360 A | 7/1975 | Cricchi et al. | |
| 3,952,325 A | 4/1976 | Beale et al. | |
| 4,016,588 A | 4/1977 | Ohya et al. | |
| 4,017,888 A | 4/1977 | Christie et al. | |
| 4,145,703 A | 3/1979 | Blanchard et al. | |
| 4,151,021 A | 4/1979 | McElroy | |
| 4,173,766 A | 11/1979 | Hayes | |
| 4,173,791 A | 11/1979 | Bell | |
| 4,247,861 A | 1/1981 | Hsu et al. | |
| 4,257,832 A | 3/1981 | Schwabe et al. | |
| 4,281,397 A | 7/1981 | Neal et al. | |
| 4,306,353 A | 12/1981 | Jacobs et al. | |
| 4,342,102 A | 7/1982 | Puar | |
| 4,342,149 A | 8/1982 | Jacobs et al. | |
| 4,360,900 A | 11/1982 | Bate | |
| 4,373,248 A | 2/1983 | McElroy | |

(Continued)

FOREIGN PATENT DOCUMENTS

EP    0 656 628    6/1995

(Continued)

OTHER PUBLICATIONS

U.S. Appl. No. 08/902,890, filed Jul. 30, 1997, Eitan.

(Continued)

Primary Examiner—Gene N. Auduong
(74) Attorney, Agent, or Firm—EMPK & Shiloh, LLP (57) ABSTRACT

As part of the present invention, a memory cell may be operated using reference cells having a threshold offset circuit. According to some embodiments of the present invention, a threshold offset value may be determined for a memory cell to be operated based on a location (e.g. memory segment within a memory array) of the memory cell. An input offset circuit of a global reference cell may be adjusted by the threshold offset value for the memory cell; and the memory cell may be operated (e.g. read, written or erased) using the global reference cell whose input offset circuit has been adjusted by the threshold offset value. According to some embodiments of the present invention global reference cells may consist of multiple sets of reference cells, wherein, according to some aspects, each set of the multiple sets of reference cells may be used for operating a different memory array segment. According to other aspects, each set of the multiple sets of reference cells may be used for operating a different state of memory array cells.

18 Claims, 7 Drawing Sheets

U.S. PATENT DOCUMENTS

| | | |
|---|---|---|
| 4,380,057 A | 4/1983 | Kotecha et al. |
| 4,388,705 A | 6/1983 | Sheppard |
| 4,389,705 A | 6/1983 | Sheppard |
| 4,404,747 A | 9/1983 | Collins |
| 4,435,786 A | 3/1984 | Tickle |
| 4,448,400 A | 5/1984 | Harari |
| 4,471,373 A | 9/1984 | Shimizu et al. |
| 4,494,016 A | 1/1985 | Ransom et al. |
| 4,507,673 A | 3/1985 | Aoyama |
| 4,521,796 A | 6/1985 | Rajkanan et al. |
| 4,527,257 A | 7/1985 | Cricchi |
| 4,586,163 A | 4/1986 | Koike |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,725,984 A | 2/1988 | Ip et al. |
| 4,733,105 A | 3/1988 | Shin et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,847,808 A | 7/1989 | Kobatake |
| 4,857,770 A | 8/1989 | Partovi et al. |
| 4,870,470 A | 9/1989 | Bass, Jr. et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,029,063 A | 7/1991 | Lingstaedt et al. |
| 5,042,009 A | 8/1991 | Kazerounian et al. |
| 5,075,245 A | 12/1991 | Woo et al. |
| 5,081,371 A | 1/1992 | Wong |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,092 A | 3/1994 | Hotta et al. |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,334,555 A | 8/1994 | Sugiyama et al. |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,375,094 A | 12/1994 | Naruke |
| 5,381,374 A | 1/1995 | Shiraishi et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,434,825 A | 7/1995 | Harari et al. |
| 5,436,478 A | 7/1995 | Bergemont et al. |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,508,968 A | 4/1996 | Collins et al. |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,018 A | 9/1996 | Wang et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee et al. |
| 5,606,523 A | 2/1997 | Mirabel |
| 5,608,679 A | 3/1997 | Mi et al. |
| 5,612,642 A | 3/1997 | McClinyock |
| 5,617,357 A | 4/1997 | Haddad et al. |
| 5,623,438 A | 4/1997 | Guritz et al. |
| 5,627,790 A | 5/1997 | Golla et al. |
| 5,633,603 A | 5/1997 | Lee |
| 5,636,288 A | 6/1997 | Bonneville et al. |
| 5,644,531 A | 7/1997 | Kuo et al. |
| 5,654,568 A | 8/1997 | Nakao |
| 5,656,513 A | 8/1997 | Wang et al. |
| 5,657,332 A | 8/1997 | Auclair et al. |
| 5,661,060 A | 8/1997 | Gill et al. |
| 5,663,907 A | 9/1997 | Frayer et al. |
| 5,672,959 A | 9/1997 | Der |

| | | |
|---|---|---|
| 5,675,280 A | 10/1997 | Nomura |
| 5,677,869 A | 10/1997 | Fazio et al. |
| 5,683,925 A | 11/1997 | Irani et al. |
| 5,689,459 A | 11/1997 | Chang et al. |
| 5,694,356 A | 12/1997 | Wong et al. |
| 5,696,929 A | 12/1997 | Hasbun et al. |
| 5,708,608 A | 1/1998 | Park et al. |
| 5,712,814 A | 1/1998 | Fratin et al. |
| 5,712,815 A | 1/1998 | Bill et al. |
| 5,715,193 A | 2/1998 | Norman |
| 5,717,581 A | 2/1998 | Canclini |
| 5,717,632 A | 2/1998 | Richart et al. |
| 5,717,635 A | 2/1998 | Akatsu |
| 5,726,946 A | 3/1998 | Yamagata et al. |
| 5,748,534 A | 5/1998 | Dunlap et al. |
| 5,751,037 A | 5/1998 | Aozasa et al. |
| 5,751,637 A | 5/1998 | Chen et al. |
| 5,754,475 A | 5/1998 | Bill et al. |
| 5,760,445 A | 6/1998 | Diaz |
| 5,760,634 A | 6/1998 | Fu |
| 5,768,192 A | 6/1998 | Eitan |
| 5,768,193 A | 6/1998 | Lee et al. |
| 5,771,197 A | 6/1998 | Kim |
| 5,774,395 A | 6/1998 | Richart et al. |
| 5,777,919 A | 7/1998 | Chi-Yung et al. |
| 5,781,476 A | 7/1998 | Seki et al. |
| 5,781,478 A | 7/1998 | Takeuchi et al. |
| 5,784,314 A | 7/1998 | Sali et al. |
| 5,787,036 A | 7/1998 | Okazawa |
| 5,793,079 A | 8/1998 | Georgescu et al. |
| 5,801,076 A | 9/1998 | Ghneim et al. |
| 5,805,500 A | 9/1998 | Campardo et al. |
| 5,808,506 A | 9/1998 | Tran |
| 5,812,449 A | 9/1998 | Song |
| 5,812,456 A | 9/1998 | Hull et al. |
| 5,812,457 A | 9/1998 | Arase |
| 5,815,435 A | 9/1998 | Van Tran |
| 5,822,256 A | 10/1998 | Bauer et al. |
| 5,825,683 A | 10/1998 | Chang et al. |
| 5,825,686 A | 10/1998 | Schmitt-Landsiedel et al. |
| 5,828,601 A | 10/1998 | Hollmer et al. |
| 5,834,851 A | 11/1998 | Ikeda et al. |
| 5,835,935 A | 11/1998 | Estakhri et al. |
| 5,836,772 A | 11/1998 | Chang et al. |
| 5,841,700 A | 11/1998 | Chang |
| 5,847,441 A | 12/1998 | Cutter et al. |
| 5,861,771 A | 1/1999 | Matsuda et al. |
| 5,862,076 A | 1/1999 | Eitan |
| 5,864,164 A | 1/1999 | Wen |
| 5,867,429 A | 2/1999 | Chen et al. |
| 5,870,334 A | 2/1999 | Hemink et al. |
| 5,870,335 A | 2/1999 | Khan et al. |
| 5,875,128 A | 2/1999 | Ishizuka et al. |
| 5,877,537 A | 3/1999 | Aoki |
| 5,880,620 A | 3/1999 | Gitlin et al. |
| 5,886,927 A | 3/1999 | Takeuchi |
| RE36,179 E | 4/1999 | Shimoda |
| 5,892,710 A | 4/1999 | Fazio et al. |
| 5,903,031 A | 5/1999 | Yamada et al. |
| 5,910,924 A | 6/1999 | Tanaka et al. |
| 5,920,503 A | 7/1999 | Lee et al. |
| 5,920,507 A | 7/1999 | Takeuchi et al. |
| 5,926,409 A | 7/1999 | Engh et al. |
| 5,930,195 A | 7/1999 | Komatsu et al. |
| 5,933,366 A | 8/1999 | Yoshikawa |
| 5,933,367 A | 8/1999 | Matsuo et al. |
| 5,936,888 A | 8/1999 | Sugawara |
| 5,940,332 A | 8/1999 | Artieri |
| 5,946,258 A | 8/1999 | Evertt et al. |
| 5,946,558 A | 8/1999 | Hsu |
| 5,949,714 A | 9/1999 | Hemink et al. |
| 5,949,728 A | 9/1999 | Liu et al. |
| 5,963,412 A | 10/1999 | En |
| 5,963,465 A | 10/1999 | Eitan |
| 5,966,603 A | 10/1999 | Eitan |
| 5,969,989 A | 10/1999 | Iwahashi |
| 5,969,993 A | 10/1999 | Takeshima |
| 5,973,373 A | 10/1999 | Krautschneider et al. |
| 5,982,666 A | 11/1999 | Campardo |
| 5,986,940 A | 11/1999 | Atsumi et al. |
| 5,990,526 A | 11/1999 | Bez et al. |
| 5,991,202 A | 11/1999 | Derhacobian et al. |
| 5,999,444 A | 12/1999 | Fujiwara et al. |
| 5,999,494 A | 12/1999 | Holzrichter |
| 6,000,006 A | 12/1999 | Bruce et al. |
| 6,005,423 A | 12/1999 | Schultz |
| 6,011,725 A | 1/2000 | Eitan |
| 6,018,186 A | 1/2000 | Hsu |
| 6,020,241 A | 2/2000 | You et al. |
| 6,028,324 A | 2/2000 | Su et al. |
| 6,030,871 A | 2/2000 | Eitan |
| 6,034,403 A | 3/2000 | Wu |
| 6,034,896 A | 3/2000 | Ranaweera et al. |
| 6,037,627 A | 3/2000 | Kitamura et al. |
| 6,040,610 A | 3/2000 | Noguchi et al. |
| 6,044,019 A | 3/2000 | Cernea et al. |
| 6,044,022 A | 3/2000 | Nachumovsky |
| 6,063,666 A | 5/2000 | Chang et al. |
| 6,064,226 A | 5/2000 | Earl |
| 6,064,251 A | 5/2000 | Park |
| 6,064,591 A | 5/2000 | Takeuchi et al. |
| 6,074,916 A | 6/2000 | Cappelletti |
| 6,075,402 A | 6/2000 | Ghilardelli et al. |
| 6,075,724 A | 6/2000 | Li et al. |
| 6,078,518 A | 6/2000 | Chevallier |
| 6,081,456 A | 6/2000 | Dadashev |
| 6,084,794 A | 7/2000 | Lu et al. |
| 6,091,640 A | 7/2000 | Kawahara et al. |
| 6,094,095 A | 7/2000 | Murray et al. |
| 6,097,639 A | 8/2000 | Choi et al. |
| 6,107,862 A | 8/2000 | Mukainakano et al. |
| 6,108,240 A | 8/2000 | Lavi et al. |
| 6,108,241 A | 8/2000 | Chevallier |
| 6,117,714 A | 9/2000 | Beatty |
| 6,118,207 A | 9/2000 | Ormerod et al. |
| 6,118,692 A | 9/2000 | Banks |
| 6,122,198 A | 9/2000 | Haddad et al. |
| 6,128,226 A | 10/2000 | Eitan et al. |
| 6,128,227 A | 10/2000 | Kim |
| 6,130,572 A | 10/2000 | Ghilardelli et al. |
| 6,130,574 A | 10/2000 | Bloch et al. |
| 6,133,095 A | 10/2000 | Eitan et al. |
| 6,134,156 A | 10/2000 | Eitan |
| 6,137,718 A | 10/2000 | Reisinger |
| 6,147,904 A | 11/2000 | Liron |
| 6,150,800 A | 11/2000 | Kinoshita et al. |
| 6,154,081 A | 11/2000 | Pakkala et al. |
| 6,156,149 A | 12/2000 | Cheung et al. |
| 6,157,242 A | 12/2000 | Fukui |
| 6,157,570 A | 12/2000 | Nachumovsky |
| 6,163,048 A | 12/2000 | Hirose et al. |
| 6,163,484 A | 12/2000 | Uekubo |
| 6,169,691 B1 | 1/2001 | Pasotti et al. |
| 6,175,523 B1 | 1/2001 | Yang et al. |
| 6,181,597 B1 | 1/2001 | Nachumovsky |
| 6,181,605 B1 | 1/2001 | Hollmer et al. |
| 6,185,143 B1 | 2/2001 | Perner et al. |
| 6,188,211 B1 | 2/2001 | Rincon-Mora et al. |
| 6,192,445 B1 | 2/2001 | Rezvani |
| 6,195,196 B1 | 2/2001 | Kimura et al. |
| 6,198,342 B1 | 3/2001 | Kawai |
| 6,201,282 B1 | 3/2001 | Eitan |
| 6,201,737 B1 | 3/2001 | Hollmer et al. |
| 6,205,056 B1 | 3/2001 | Pan et al. |
| 6,205,059 B1 | 3/2001 | Gutala et al. |
| 6,208,200 B1 | 3/2001 | Arakawa |

| Patent | Date | Inventor |
|---|---|---|
| 6,208,557 B1 | 3/2001 | Bergemont et al. |
| 6,214,666 B1 | 4/2001 | Mehta |
| 6,215,148 B1 | 4/2001 | Eitan |
| 6,215,697 B1 | 4/2001 | Lu et al. |
| 6,215,702 B1 | 4/2001 | Derhacobian et al. |
| 6,218,695 B1 | 4/2001 | Nachumovsky |
| 6,219,277 B1 | 4/2001 | Devin et al. |
| 6,219,290 B1 | 4/2001 | Chang et al. |
| 6,222,762 B1 | 4/2001 | Guterman et al. |
| 6,222,768 B1 | 4/2001 | Hollmer et al. |
| 6,233,180 B1 | 5/2001 | Eitan et al. |
| 6,240,032 B1 | 5/2001 | Fukumoto |
| 6,240,040 B1 | 5/2001 | Akaogi et al. |
| 6,246,555 B1 | 6/2001 | Tham |
| 6,252,442 B1 | 6/2001 | Malherbe |
| 6,252,799 B1 | 6/2001 | Liu et al. |
| 6,256,231 B1 | 7/2001 | Lavi et al. |
| 6,261,904 B1 | 7/2001 | Pham et al. |
| 6,265,268 B1 | 7/2001 | Halliyal et al. |
| 6,266,281 B1 | 7/2001 | Derhacobian et al. |
| 6,272,047 B1 | 8/2001 | Mihnea et al. |
| 6,275,414 B1 | 8/2001 | Randolph et al. |
| 6,281,545 B1 | 8/2001 | Liang et al. |
| 6,282,133 B1 | 8/2001 | Nakagawa et al. |
| 6,282,145 B1 | 8/2001 | Tran et al. |
| 6,285,246 B1 | 9/2001 | Basu |
| 6,285,574 B1 | 9/2001 | Eitan |
| 6,285,589 B1 | 9/2001 | Kajitani |
| 6,285,614 B1 | 9/2001 | Mulatti et al. |
| 6,292,394 B1 | 9/2001 | Cohen et al. |
| 6,297,096 B1 | 10/2001 | Boaz |
| 6,297,143 B1 | 10/2001 | Foote et al. |
| 6,297,974 B1 | 10/2001 | Ganesan et al. |
| 6,304,485 B1 | 10/2001 | Harari et al. |
| 6,307,784 B1 | 10/2001 | Hamilton et al. |
| 6,307,807 B1 | 10/2001 | Sakui et al. |
| 6,320,786 B1 | 11/2001 | Chang et al. |
| 6,324,094 B1 | 11/2001 | Chevallier |
| 6,326,265 B1 | 12/2001 | Liu et al. |
| 6,330,192 B1 | 12/2001 | Ohba et al. |
| 6,331,950 B1 | 12/2001 | Kuo et al. |
| 6,335,874 B1 | 1/2002 | Eitan |
| 6,337,502 B1 | 1/2002 | Eitan et al. |
| 6,339,556 B1 | 1/2002 | Watanabe |
| 6,343,033 B1 | 1/2002 | Parker |
| 6,346,442 B1 | 2/2002 | Aloni et al. |
| 6,348,381 B1 | 2/2002 | Jong |
| 6,348,711 B1 | 2/2002 | Eitan |
| 6,351,415 B1 | 2/2002 | Kushnarenko |
| 6,353,356 B1 | 3/2002 | Liu |
| 6,353,554 B1 | 3/2002 | Banks |
| 6,353,555 B1 | 3/2002 | Jeong |
| 6,356,469 B1 | 3/2002 | Roohparvar et al. |
| 6,359,501 B2 | 3/2002 | Lin et al. |
| 6,374,337 B1 | 4/2002 | Estakhri |
| 6,385,086 B1 | 5/2002 | Mihara et al. |
| 6,396,741 B1 | 5/2002 | Bloom et al. |
| 6,400,209 B1 | 6/2002 | Matsuyama et al. |
| 6,400,607 B1 | 6/2002 | Pasotti et al. |
| 6,407,537 B2 | 6/2002 | Antheunis |
| 6,410,388 B1 | 6/2002 | Kluth et al. |
| 6,417,081 B1 | 7/2002 | Thurgate |
| 6,418,506 B1 | 7/2002 | Pashley et al. |
| 6,426,898 B1 | 7/2002 | Mihnea et al. |
| 6,429,063 B1 | 8/2002 | Eitan |
| 6,433,624 B1 | 8/2002 | Grossnikle et al. |
| 6,436,766 B1 | 8/2002 | Rangarajan et al. |
| 6,436,768 B1 | 8/2002 | Yang et al. |
| 6,438,031 B1 | 8/2002 | Fastow |
| 6,438,035 B2 | 8/2002 | Yamamoto et al. |
| 6,440,797 B1 | 8/2002 | Wu et al. |
| 6,442,074 B1 | 8/2002 | Hamilton et al. |
| 6,445,030 B1 | 9/2002 | Wu et al. |
| 6,449,190 B1 | 9/2002 | Bill |
| 6,452,438 B1 | 9/2002 | Li |
| 6,456,528 B1 | 9/2002 | Chen |
| 6,456,533 B1 | 9/2002 | Hamilton et al. |
| 6,458,656 B1 | 10/2002 | Park et al. |
| 6,458,677 B1 | 10/2002 | Hopper et al. |
| 6,469,929 B1 | 10/2002 | Kushnarenko et al. |
| 6,469,935 B2 | 10/2002 | Hayashi |
| 6,472,706 B2 | 10/2002 | Widdershoven et al. |
| 6,477,085 B1 | 11/2002 | Kuo |
| 6,490,204 B2 | 12/2002 | Bloom et al. |
| 6,496,414 B2 | 12/2002 | Kasa et al. |
| 6,510,082 B1 | 1/2003 | Le et al. |
| 6,512,701 B1 | 1/2003 | Hamilton et al. |
| 6,519,180 B2 | 2/2003 | Tran et al. |
| 6,519,182 B1 | 2/2003 | Derhacobian et al. |
| 6,522,585 B2 | 2/2003 | Pasternak |
| 6,525,969 B1 | 2/2003 | Kurihara et al. |
| 6,528,390 B2 | 3/2003 | Komori et al. |
| 6,529,412 B1 | 3/2003 | Chen et al. |
| 6,532,173 B2 | 3/2003 | Lioka et al. |
| 6,535,020 B1 | 3/2003 | Yin |
| 6,535,434 B2 | 3/2003 | Maayan et al. |
| 6,537,881 B1 | 3/2003 | Rangarajan et al. |
| 6,538,270 B1 | 3/2003 | Randolph et al. |
| 6,541,816 B2 | 4/2003 | Ramsbey et al. |
| 6,552,387 B1 | 4/2003 | Eitan |
| 6,555,436 B2 | 4/2003 | Ramsbey et al. |
| 6,559,500 B2 | 5/2003 | Torii |
| 6,562,683 B1 | 5/2003 | Wang et al. |
| 6,566,194 B1 | 5/2003 | Ramsbey et al. |
| 6,566,699 B2 | 5/2003 | Eitan |
| 6,567,303 B1 | 5/2003 | Hamilton et al. |
| 6,567,312 B1 | 5/2003 | Torii et al. |
| 6,570,211 B1 | 5/2003 | He et al. |
| 6,574,139 B2 | 6/2003 | Kurihara |
| 6,577,514 B2 | 6/2003 | Shor et al. |
| 6,577,532 B1 | 6/2003 | Chevallier |
| 6,577,547 B2 | 6/2003 | Ukon |
| 6,583,005 B2 | 6/2003 | Hashimoto et al. |
| 6,583,479 B1 | 6/2003 | Fastow et al. |
| 6,584,017 B2 | 6/2003 | Maayan et al. |
| 6,590,811 B1 | 7/2003 | Hamilton et al. |
| 6,593,606 B1 | 7/2003 | Randolph et al. |
| 6,594,181 B1 | 7/2003 | Yamada |
| 6,608,526 B1 | 8/2003 | Sauer |
| 6,614,295 B2 | 9/2003 | Tsuchi |
| 6,614,686 B1 | 9/2003 | Kawamura |
| 6,614,692 B2 | 9/2003 | Eliyahu et al. |
| 6,617,179 B1 | 9/2003 | Kim |
| 6,617,215 B1 | 9/2003 | Halliyal et al. |
| 6,618,290 B1 | 9/2003 | Wang et al. |
| 6,624,672 B2 | 9/2003 | Confaloneri et al. |
| 6,627,555 B2 | 9/2003 | Eitan et al. |
| 6,630,384 B1 | 10/2003 | Sun et al. |
| 6,633,496 B2 | 10/2003 | Maayan et al. |
| 6,633,499 B1 | 10/2003 | Eitan et al. |
| 6,633,956 B1 | 10/2003 | Mitani |
| 6,636,440 B2 | 10/2003 | Maayan et al. |
| 6,639,271 B1 | 10/2003 | Zheng et al. |
| 6,639,837 B2 | 10/2003 | Takano et al. |
| 6,639,844 B1 | 10/2003 | Liu et al. |
| 6,639,849 B2 | 10/2003 | Takahashi et al. |
| 6,642,148 B1 | 11/2003 | Ghandehari et al. |
| 6,642,573 B1 | 11/2003 | Halliyal et al. |
| 6,642,586 B2 | 11/2003 | Takahashi |
| 6,643,170 B2 | 11/2003 | Huang et al. |
| 6,643,177 B1 | 11/2003 | Le et al. |
| 6,643,178 B2 | 11/2003 | Kurihara |
| 6,643,181 B2 | 11/2003 | Sofer et al. |
| 6,645,801 B1 | 11/2003 | Ramsbey et al. |
| 6,649,972 B2 | 11/2003 | Eitan |
| 6,650,568 B2 | 11/2003 | Iijima |

| | | | | | | |
|---|---|---|---|---|---|---|
| 6,653,190 | B1 | 11/2003 | Yang et al. | 2004/0151034 A1 | 8/2004 | Shor et al. |
| 6,653,191 | B1 | 11/2003 | Yang et al. | 2004/0153621 A1 | 8/2004 | Polansky et al. |
| 6,654,296 | B2 | 11/2003 | Jang et al. | 2004/0157393 A1 | 8/2004 | Hwang |
| 6,664,588 | B2 | 12/2003 | Eitan | 2004/0222437 A1 | 11/2004 | Avni et al. |
| 6,665,769 | B2 | 12/2003 | Cohen et al. | 2005/0117395 A1 | 6/2005 | Maayan et al. |
| 6,670,241 | B1 | 12/2003 | Kamal et al. | 2005/0140405 A1 | 6/2005 | Do et al. |
| 6,670,669 | B1 | 12/2003 | Kawamura | | | |
| 6,674,138 | B1 | 1/2004 | Halliyal et al. | | | |

FOREIGN PATENT DOCUMENTS

| | | |
|---|---|---|
| EP | 0751560 | 6/1995 |
| EP | 0693781 | 1/1996 |
| EP | 0 822 557 | 2/1998 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1 091 418 | 4/2001 |
| EP | 1126468 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 04-291962 | 10/1992 |
| JP | 05021758 | 1/1993 |
| JP | 06151833 | 5/1994 |
| JP | 06-232416 | 8/1994 |
| JP | 07193151 | 7/1995 |
| JP | 08-106791 | 4/1996 |
| JP | 08-297988 | 11/1996 |
| JP | 09-017981 | 1/1997 |
| JP | 09162314 | 6/1997 |
| JP | 10-106276 | 4/1998 |
| JP | 10 334676 | 12/1998 |
| JP | 11-162182 | 1/1999 |
| JP | 11-354758 | 12/1999 |
| JP | 2001-085646 | 3/2001 |
| JP | 2001-118392 | 4/2001 |
| JP | 2001-156189 | 6/2001 |
| JP | 2002-216488 | 8/2002 |
| JP | 3358663 | 10/2002 |
| WO | WO 81/00790 | 3/1981 |
| WO | WO 96/15553 | 5/1996 |
| WO | WO 96/25741 | 8/1996 |
| WO | WO 98/03977 | 2/1998 |
| WO | WO 99/31670 | 6/1999 |
| WO | WO 99/57728 | 11/1999 |
| WO | WO 00/46808 | 8/2000 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/032393 | 4/2003 |
| WO | WO 03/036651 | 5/2003 |
| WO | WO 03/054964 | 7/2003 |
| WO | WO 03/063167 | 7/2003 |
| WO | WO 03/063168 | 7/2003 |
| WO | WO 03/079370 | 9/2003 |
| WO | WO 03/079446 | 9/2003 |
| WO | WO 03/083916 | 10/2003 |
| WO | WO 03/088258 | 10/2003 |
| WO | WO 03/088259 | 10/2003 |
| WO | WO 03/088260 | 10/2003 |

| | | | |
|---|---|---|---|
| 6,677,805 | B2 | 1/2004 | Shor et al. |
| 6,680,509 | B1 | 1/2004 | Wu et al. |
| 6,686,242 | B2 | 2/2004 | Willer et al. |
| 6,690,602 | B1 | 2/2004 | Le et al. |
| 6,700,818 | B2 | 3/2004 | Shappir et al. |
| 6,714,469 | B2 * | 3/2004 | Rickes et al. ............... 365/201 |
| 6,717,207 | B2 | 4/2004 | Kato |
| 6,723,518 | B2 | 4/2004 | Papsidero et al. |
| 6,731,542 | B1 | 5/2004 | Le et al. |
| 6,738,289 | B2 | 5/2004 | Gongwer et al. |
| 6,744,692 | B2 | 6/2004 | Shiota et al. |
| 6,765,259 | B2 | 7/2004 | Kim |
| 6,768,165 | B1 | 7/2004 | Eitan |
| 6,788,579 | B2 | 9/2004 | Gregori et al. |
| 6,791,396 | B2 | 9/2004 | Shor et al. |
| 6,794,249 | B2 | 9/2004 | Palm et al. |
| 6,831,872 | B2 | 12/2004 | Matsuoka |
| 6,836,431 | B2 | 12/2004 | Chang |
| 6,871,258 | B2 | 3/2005 | Micheloni et al. |
| 6,885,585 | B2 | 4/2005 | Maayan et al. |
| 6,912,160 | B2 | 6/2005 | Yamada |
| 6,917,544 | B2 | 7/2005 | Maayan et al. |
| 6,928,001 | B2 | 8/2005 | Avni et al. |
| 6,937,523 | B2 | 8/2005 | Eshel |
| 6,963,505 | B2 * | 11/2005 | Cohen ..................... 365/185.2 |
| 6,967,872 | B2 | 11/2005 | Quader et al. |
| 6,996,692 | B2 | 2/2006 | Kouno |
| 7,149,240 | B2 * | 12/2006 | McDonough et al. ....... 375/146 |
| 7,184,313 | B2 * | 2/2007 | Betser et al. .......... 365/185.24 |
| 2001/0006477 | A1 | 7/2001 | Banks |
| 2002/0004878 | A1 | 1/2002 | Norman |
| 2002/0004921 | A1 | 1/2002 | Muranaka et al. |
| 2002/0064911 | A1 | 5/2002 | Eitan |
| 2002/0132436 | A1 | 9/2002 | Eliyahu et al. |
| 2002/0140109 | A1 | 10/2002 | Keshavarzi et al. |
| 2002/0145465 | A1 | 10/2002 | Shor et al. |
| 2002/0191465 | A1 | 12/2002 | Maayan et al. |
| 2002/0199065 | A1 | 12/2002 | Subramoney et al. |
| 2003/0001213 | A1 | 1/2003 | Lai |
| 2003/0021155 | A1 | 1/2003 | Yachareni et al. |
| 2003/0072192 | A1 | 4/2003 | Bloom et al. |
| 2003/0076710 | A1 | 4/2003 | Sofer et al. |
| 2003/0117841 | A1 | 6/2003 | Yamashita |
| 2003/0131186 | A1 | 7/2003 | Buhr |
| 2003/0134476 | A1 | 7/2003 | Roizin et al. |
| 2003/0142544 | A1 | 7/2003 | Maayan et al. |
| 2003/0145176 | A1 | 7/2003 | Dvir et al. |
| 2003/0145188 | A1 | 7/2003 | Cohen et al. |
| 2003/0155659 | A1 | 8/2003 | Verma et al. |
| 2003/0190786 | A1 | 10/2003 | Ramsbey et al. |
| 2003/0197221 | A1 | 10/2003 | Shinozaki et al. |
| 2003/0202411 | A1 | 10/2003 | Yamada |
| 2003/0206435 | A1 | 11/2003 | Takahashi |
| 2003/0208663 | A1 | 11/2003 | Van Buskirk et al. |
| 2003/0209767 | A1 | 11/2003 | Takahashi et al. |
| 2003/0214844 | A1 | 11/2003 | Iijima |
| 2003/0218207 | A1 | 11/2003 | Hashimoto et al. |
| 2003/0218913 | A1 | 11/2003 | Le et al. |
| 2003/0222303 | A1 | 12/2003 | Fukuda et al. |
| 2003/0227796 | A1 | 12/2003 | Miki et al. |
| 2004/0012993 | A1 | 1/2004 | Kurihara |
| 2004/0013000 | A1 | 1/2004 | Torii |
| 2004/0014290 | A1 | 1/2004 | Yang et al. |
| 2004/0021172 | A1 | 2/2004 | Zheng et al. |
| 2004/0027858 | A1 | 2/2004 | Takahashi et al. |

| | | |
|---|---|---|
| WO | WO 03/088261 | 10/2003 |
| WO | WO 03/088353 | 10/2003 |
| WO | WO 03/100790 | 12/2003 |

OTHER PUBLICATIONS

Bude et al., EEPROM/Flash Sub 3.0V drain—Source Bias Hot Carrier Writing, IEDM, 1995, 989-992.

Bude et al., Secondary Electron Flash—a High Performance, Low Power Flash Technology for 0.35 um and below, IEDM, 1997, 279-282.

Bude et al., Modeling Nonequilibrium Hot Carrier Device Effects, Conference of Insulator Specialists of Europe, Jun. 1997, Sweden.

Jung et al., IEEE Journal of Solid-State Circuits, Nov. 1996, 1575-1583, vol. 31, No. 11.

Campardo et al., IEEE Journal of Solid-State Circuits, Nov. 2000, 1655-1667, vol. 35, No. 11.

Lin et al., Novel Source-Controlled Self-Verified Programming for Multilevel EEPROM's, IEEE Transactions on Electron Devices, Jun. 2000, 1166-1174, vol. 47, No. 6.

Chan et al., A True Single-Transistor Oxide-Nitride-Oxide EEPROM Device, IEEE Electron Device Letters, Mar. 1987, vol. EDL-8, No. 3.

Eitan et al., "Hot-Electron Injection into the Oxide in n-Channel MOS Devices", IEEE Transactions on Electron Devices, vol. ED-28, No. 3, pp. 328-370, Mar. 1981.

Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.

Ma et al., A Dual-bit Split-Gate EEPROM (DSG) Cell in Contactless Array for Single-Vcc High Density Flash Memories, IEEE, 1994, 57-60.

Oshima et al., Process and Device Technologies for 16Mbit EEPROMs with Large-Tilt-Angle Implantated P-Pocket Cell, IEEE, Dec. 1990, Ch. 2865-4/90/0000-0095, pp. 521-524, San Francisco, California.

Lee, A new approach for the floating-gate MOS nonvolatile memory, Applied Physics Letters, Oct. 1977, 475-476, vol. 31, No. 7, American Institute of Physics.

Glasser et al., MOS Device Electronics, The Design and Analysis of VLSI Circuits, Chapter 2, 67-163, 1998, Addison-Wesley Publishing Company.

Bhattacharyya et al., FET Gate Structure for Nonvolatile N-Channel Read-Mostly Memory Device, IBM Technical Disclosure Bulletin, Nov. 1975, 1768, vol. 18, No. 6.

Ricco et al., Nonvolatile Multilevel Memories for Digital Applications, Dec. 1998, 2399-2421, vol. 86, No. 12, Institute of Electrical and Electronics Engineers, Inc.

Martin, Improved Circuits for the Realization of Switched-Capacitor Filters, IEEE Transactions on Circuits and Systems, Apr. 1980, 237-244, vol. CAS-27.

Tseng et al., "Thin CVD Stacked Gate Dielectric for ULSI Technology", IEEE, pp. 321-214; 1993, 13.1.1-131.4.

Pickar, Ion Implementation is Silicon—Physics, Processing, and Microelectronic Devices, Applied Solid State Science 1975, 151-241, vol. 5, Academic Press.

2 Bit/Cell EEPROM Cell Using Band-To-Band Tunneling for Data Read-Out, IBM Technical Disclosure Bulletin, 1992, 136-140, vol. 35, No. 4B.

Umezawa et al., A 5-V Only Operation 0.6-µm Flash EEPROM with Row Decoder Scheme in Triple-Well Structure, IEEE Journal of Solid-State Circuits, 1992, 1540, vol. 27.

Mitchell et al., A new self-aligned planar array cell for ultra high density EPROMS, 1987.

Esquivel et al., High Density Contactless, Self Aligned EPROM Cell Array Technology, 1986.

Johns, Martin, Analog Integrated Circuit Design, Jun. 1, 1997, Chapter 10, John Wiley and Sons Inc.

Allen et al., CMOS Analog Circuit Design, 2002, 259 pages, Oxford University Press.

Klinke et al., A very-high-slew-rate CMOS operational amplifier, IEEE Journal of Solid-State Circuits, 1989, 744-746, 24 vol.

Shor et al, paper WA2.04.01—Self regulated Four phased charge pump with boosted wells, ISCAS 2002.

Fotouhi, An efficient CMOS line driver for 1.544-Mb/s T1 and 2.048-Mb/s E1 applications, IEEE Journal of Solid-State Circuits, 2003, 226-236pages, 38 vol.

P-N Junction Diode, Physics of semiconductor devices, 1981, Ch. 2, "A Wiley-Interscience Publication", John Wiley & Sons Publishers.

Chang, Non Volatile Semiconductor Memory Devices, Proceedings of the IEEE, 64 vol., No. 7, pp. 1039-1059; Jul. 1976.

Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.

4 Bits of Digital Data Fit in a Single Cell, Technology Newsletter, Electronic Design, Apr. 1, 1996.

M. Specht et al, Novel Dual Bit Tri- Gate Charge Trapping Memory Devices, IEEE Electron Device Letters, vol. 25, No. 12, Dec. 2004, pp. 810-812.

Bu, Jiankang et al., "Design Considerations in Scaled SONOS Nonvolatile Memory Devices" Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.

Adams et al., "SONOS Nonvolatile Semiconductor Memories for Space and Military Applications", Symposium, 2000. http://klabs.org/richcontent/MemoryContent/nvmt_symp/nvmts_2000/papers/adams_d.pdf.

"Philips Research—Technologies—Embedded Nonvolatile Memories" http://research.philips.com/technologies/ics/nvmemories/index.html, unknown date.

"Semiconductor Memory: Non-Volatile Memory (NVM)", National University of Singapore, Department of Electrical and Computer Engineering: http://ece.nus.edu.sg/stfpage/elezhucx/myweb/NVM.pdf, unknown date.

"Saifun Non-Volatile Memory Technology", 1st Edition, 2005, published and written by Saifun Semiconductors Ltd., 1110 pgs.

* cited by examiner

METHOD, SYSTEM, AND CIRCUIT FOR OPERATING A NON-VOLATILE MEMORY ARRAY

FIELD OF THE DISCLOSURE

The present disclosure relates generally to the field of semiconductors. More particularly, the present disclosure relates to a system and method of operating one or more (e.g. an array) of nonvolatile memory ("NVM") cells.

BACKGROUND

As is well known in the art, non-volatile memory (NVM) cells may have bits stored therein that may be read, such as by means of a sense amplifier. In general, the sense amplifier determines the logical value stored in the cell by comparing the output of the cell with a reference level. If the current output is above the reference, the cell is considered erased (with a logical value of 1) and if the current output is below the reference, the cell is considered programmed (with a logical value of 0). In terms of threshold voltage of the cell itself, programming a cell increases the threshold voltage of the cell, whereas erasing decreases the threshold voltage.

Different curent levels are associated with different logical states, and a NVM cell's current level may be correlated to the amount of charge stored in a charge storage region of the cell. The cell prior to the storing of any charge within a charge storage region may be referred to as "native" or in its "initial" state.

Generally, in order to determine whether an NVM cell is at a specific state, for example erased, programmed, or programmed at one of multiple possible program states within a multi-level cell ("MLC"), the cell's current level is compared to that of a reference cell whose current level is preset at a level associated with the specific state being tested for.

In the simplest case, a "program verify" reference cell with a current set at level defined as a "program verily" level may be compared to a cell being programmed (i.e. charged) in order to determine whether a charge storage area of the cell has been sufficiently charged so as to be considered "programmed."

In the case where the cell is an MLC, the cell may have several possible program states, and one or more program reference cells, each with one or more different current levels corresponding to each of the NVM cell's possible program states, may be used to determine the state of the MLC.

For reading a cell, the current levels of one or more "read verify" reference cells may be compared to the current of the cell being read. An "erase verify" reference cell with a current set at a level defined as an "erase verify" level may be compared against a memory cell during an erase operation in order to determine when the memory cell's charge storage area has been sufficiently discharged so as to consider the cell erased.

Enough margins should be kept between the different reference levels so that the logical state interpretation is free of mistakes under the differrent operation conditions (e.g. temperature and voltages changes and retention of the stored charge). In the simplest case it is common to define the margin between the read level and the erase verify level as the "erase margin" and the margin between the read level and the program verify level as the "program margin". The margin between the initial NVM cell level and the lowest reference level, usually the erase verify level, is reffer to as 'cycle margin' ("CM"). Other margins and levels may be defined for different purposes. In a MLC NVM, few margins and levels are defined to assure a correct operation and interpretation of the different levels.

The positioning of the different reference levels is accomplished using data extracted from the NVM array during manufacturing. That is, during the manufacturing process, after fabrication, an NVM array may be tested to determine the native current levels of each of its cells. The presetting of the reference level is made using this data.

Figure 1:
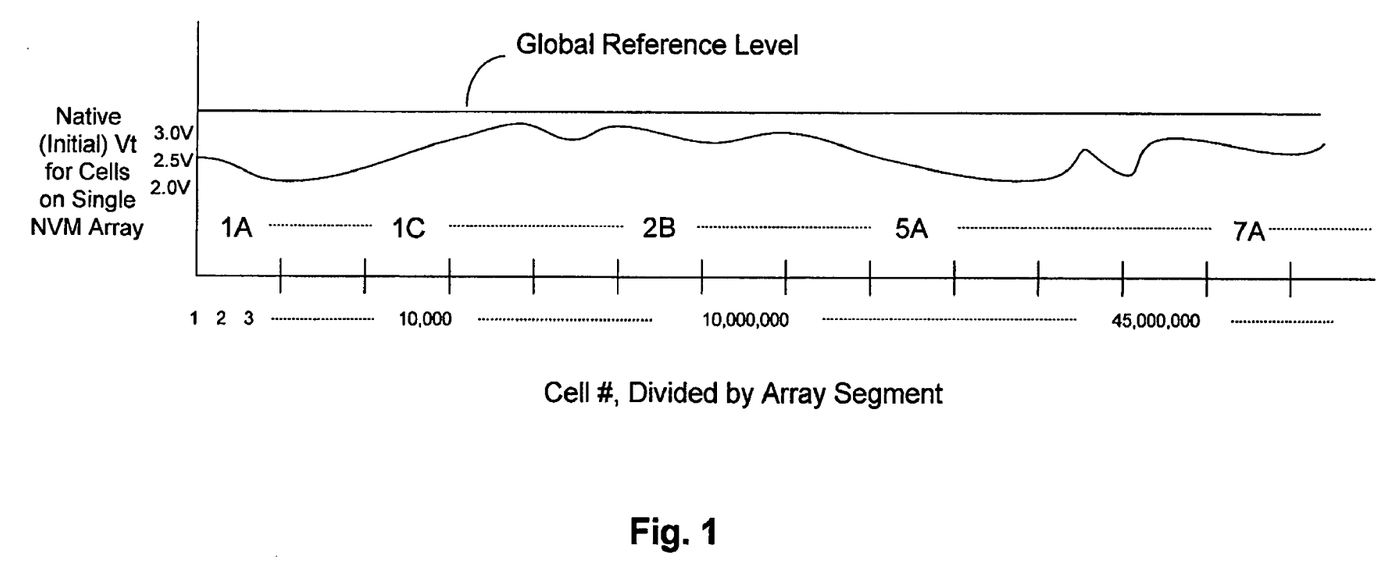
FIG. 1 is a graph showing an example of a possible native threshold voltage distribution between NVM cells in an NVM array, where the cells are numbered and grouped into array segments such that consecutively numbered cells are generally adjacent to one another and cells in the same array segments are generally in proximity with one another.

As FIG. 1 shows, native threshold voltages, and hence native currents, distribution across an NVM array may be different in different segments of the NVM array. Native threshold voltage distributions on an array may be in the order of 0.7V or more across the array. However, the distributions across an array segment may be lower, for example 0.2V. Thus, establishing the lowest reference voltage to be slightly higher than the highest native threshold voltage of the array (e.g., native threshold voltage found in a NVM cell in segment 1D of FIG. 1) may result in a large CM for cells in array segments whose NVM cells have native threshold voltages relatively lower than those in the segment with the NVM cell having the highest native threshold voltage.

SUMMARY

The following embodiments and aspects thereof are described and illustrated in conjunction with systems, tools and methods, which are meant to be exemplary and illustrative, not limiting in scope. In various embodiments, one or more of the above-described problems have been reduced or eliminated, while other embodiments are directed to other advantageous or improvements.

The present invention is a system, method and circuit for operating an array of memory cells. According to some embodiments of the present invention, NVM cells of an array may be tested to determine a native threshold voltage distribution across the array and, if so desired or required, across array segments. A lowest reference voltage level for each array segment may be determined, where the lowest reference voltage level may be used to test or verify the logical state of the NVM cells associated with the lowest threshold voltage (e.g. erase state). The lowest reference voltage for each segment may be determined to be equal to or greater or lower than the highest native threshold voltage of any cell within the given array segment.

As part of the present invention, the lowest reference voltage determined for each segment may be stored in a reference voltage table associated with the NVM array. According to some embodiments of the present invention, other segment-specific reference voltage levels may be stored in a "reference voltage table", such that the table may contain entries with values correlated to, or associated with, reference voltage levels associated with each array segment. The reference voltage levels correlated to, or associated with, a given array segment may be, for example, program verify voltage level for that segment, read verify voltage level for that segment, etc. That is, the table may contain one or more entries for each one of a plurality of array segments, where the one or more entries per array segment may be correlated to one or more reference voltages for the given segment.

According to some embodiments of the present invention, an entry in a reference voltage table may indicate the absolute reference voltage associated with a specific logical state of a specific array segment (e.g. erase verify reference voltage for segment 1D=3.5V). In some other embodiments of the present invention, an entry in the table may indicate an offset value between a global reference voltage and a local reference voltage associated with a specific logical state of a specific array segment. For example, if a global erase verify reference voltage level is set to, or selected to be, 3.2V, but the erase verify reference voltage level (being the "local' reference voltage") for segment 1D has been determined to be 3.5V, the table entry associated with an erase verify reference voltage for segment 1D may indicate an offset voltage of 0.3V.

As part of the present invention, a NVM cell within an array of NVM cells may be operated using an entry in a reference voltage table associated with the array. When attempting to verify a logical state of a NVM cell in a specific array segment, a table entry associated with the given logical state, within the given array segment, may be read. The entry may be correlated to a reference voltage associated with the given logical state in the given array segment. The entry may either indicate a specific reference voltage associated with the given logical state within the given array segment, or the entry may indicate an offset value between a global reference voltage and a local reference voltage associated with the given logical state of in the given array segment. For example, if a global erase verify voltage level is set to 3.2V, but the erase verify voltage level for segment 1D has been determined to be 3.5V, the table entry associated with an erase verify reference voltage for segment 1D may indicate an offset voltage value of 0.3V.

According to some embodiments of the present invention, an electric circuit may provide an electric signal having a voltage, or current, level to operate either a NVM cell in an NVM array or to operate a reference cell associated with the array, or a segment thereof, wherein the provided voltage, or current, level may be correlated to an entry in the table. According to some embodiments of the present invention, the electric circuit may be an input offset circuit which may offset a voltage, or current, level of a signal provided by a charge pump or by other power supply circuit. In some embodiments of the present invention, the electric circuit may be part of a charge pump or part of another power supply circuit. The electric circuit may be used to either supply a signal to NVM cells in an NVM array or to reference cells associated with the NVM array or selected segments thereof.

According to some embodiments of the present invention, the global reference cells may include multiple sets of reference cells, wherein, according to some aspects, each set of the multiple sets of reference cells may be used for operating a different memory array segment. Accoridng to other aspects, each set of the multiple sets of reference cells may he used for operating a different state of memory array cells.

In addition to the exemplary aspects and embodiments described above, further aspects and embodiments will become apparent by reference to the figures and by study of the following detailed description.

BRIEF DESCRIPTION OF THE FIGURES

Exemplary embodiments are illustarted in referenced figures. It is intended that the embodiments and figures disclosed herein are to be considred illustrative rashter than restrictive. Aspects of the present invention may best be understood by reference to the following detailed description when read with the accompanying figures, in which.

In the drawings, like numerals describe substantially similar components throughout the serial views.

DETAILED DESCRIPTION

In the following detailed description, numerous specific details are set forth in order to provide a thorough understanding of the invention. However, it will be understood by those of ordinary skill in the art that the present invention may be practiced without these specific details. In other instances, well-known methods, procedures, and components have not been described in detail so as not to obscure the present invention.

The present invention is a system, method and circuit for operating an array of memory cells. According to some embodiments of the present invention, NVM cells of an array may be tested to determine a native threshold voltage distribution across the array and across array segments. A lowest reference voltage level for each array segment may be determined, where the lowest reference voltage level may be used to test or verify the logical state of the NVM cells associated with the lowest threshold voltage (e.g. erase state). The lowest reference voltage for each segment may be determined to be equal to or greater or lower than the highest native threshold voltage of any cell within the given array segment.

As part of the present invention, the lowest reference voltage determined for each segment may be stored in a reference voltage table associated with the NVM array. According to some embodiments of the present invention, other segment-specific reference voltage levels may be stored in a reference voltage table, such that the table may contain entries with values correlated to reference voltage levels associated with each array segment (e.g. program verify voltage level for the given segment, read verify voltage level for the segment, etc.). Additionally or alternatively, the reference voltage table may contain pointers to point at different sets of reference cells that were precharged during their manufacturing process to output different reference signals, whether currents or voltages. That is, the reference voltage table may contain one or more entries for each of a plurality of array segments, where the one or more entries per segment may be correlated to one or more reference voltages for the given segment.

In some embodiments of the present invention, an entry in a reference voltage table may indicate the absolute reference voltage associated with a specific logical state of a specific array segment (e.g. erase verify reference voltage for segment 1D=3.5V). In some other embodiments of the present invention, an entry in the table may indicate an offset value between a global reference voltage and a local reference voltage associated with a specific logical state of a specific array segment For example, if a global erase verify voltage level is set to 3.2V, but the erase verify reference voltage level for segment 1D has been determined to be 3.5V, the table entry associated with an erase verify reference voltage for segment 1D may indicate an offset voltage of 0.3V. In different embodiements the table may contain a pointer to a reference cell set.

As part of the present invention, a NVM cell within an array of a NVM cells may be operated using an entry in a reference voltage table associated with the array. When attempting to verify a logical state of a NVM cell in a specific array segment, a table entry associated with the given logical state, within the given array segment, may be read. The entry may be correlated to a reference voltage associated with the given logical state in the given array segment. The entry may either indicate a specific reference voltage associated with the given logical state within the array segment, or the entry may indicate an offset value between a global reference voltage and a local reference voltage associated with the given logical state in the given array segment. For example, if a global erase verify voltage level is set to 3.2V, but the erase verify voltage level for segment 1D has been determined to be 3.5V, the table entry associated with an erase verify reference voltage for segment 1D may indicate an offset voltage value of 0.3V.

According to some embodiments of the present invention, an electric circuit may provide an electric signal having a voltage level to operate either a NVM cell in an NVM array or to operate a reference cell associated with the array, wherein the provided voltage level may be correlated to an entry in the table. According to some embodiments of the present invention, the electric circuit may be an input offset circuit which may offset a voltage level of a signal provided by a charge pump or by another power supply circuit. In some embodiments of the present invention, the electric circuit may be part of a charge pump or part of another power supply circuit. The electric circuit may be used to either supply a signal to NVM cells in a NVM array or to reference cells associated with the NVM array.

Figure 2:
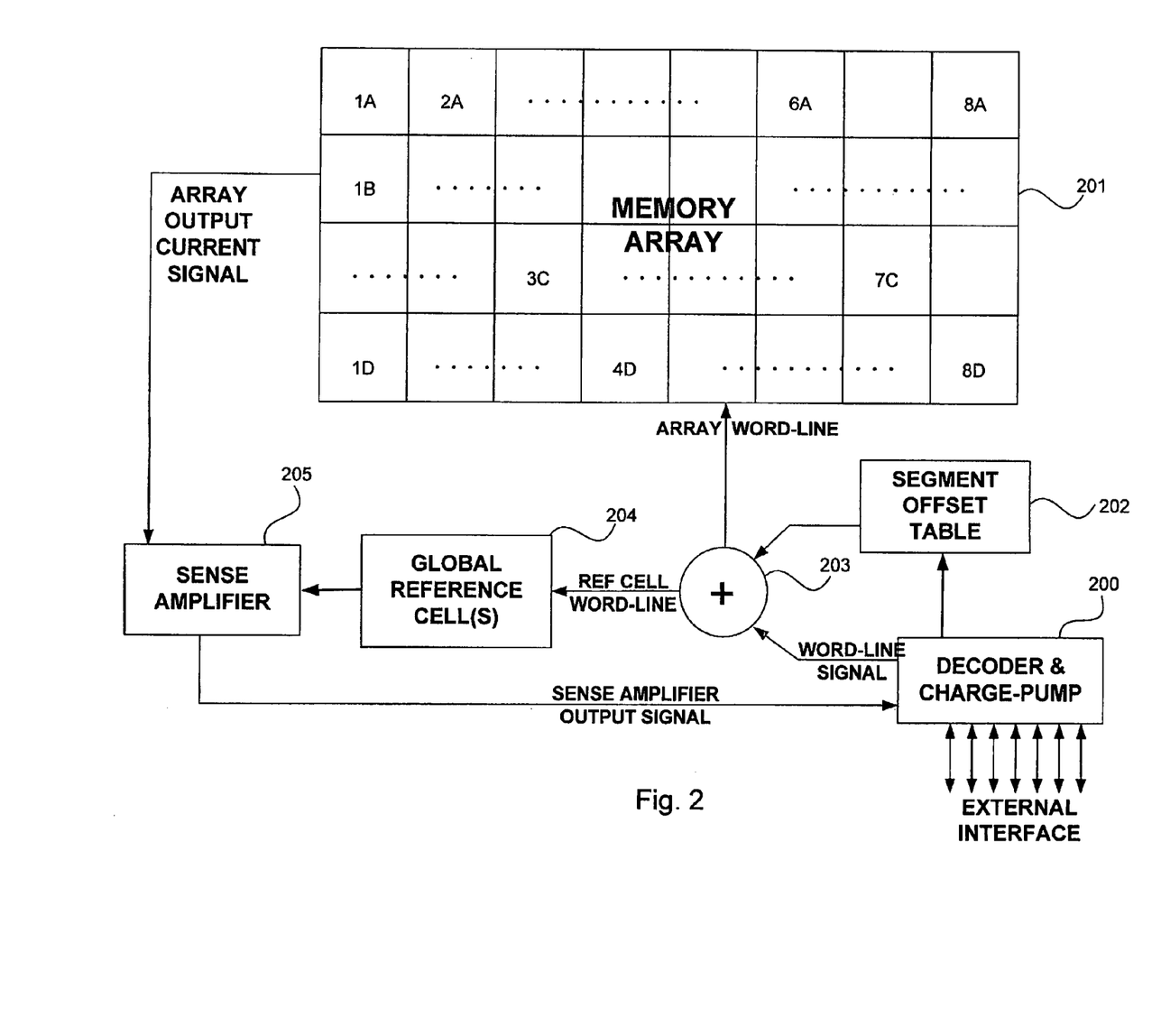
FIG. 2 is a block diagram illustration of an exemplary circuit for operating a NVM array, where an offset voltage/current is applied both to the NVM array cells and to the reference cells, according to some embodiments of the present invention.

Reference is now made to FIG. 2, which schematically illustrates an exemplary circuit for operating a NVM array 201 according to some embodiments of the present invention. A circuit 200 may include a charge pump or other electric signal source. The circuit 200 may include an external interface to enable decoder 200 to receive and send data from/to external applications.

When attempting to verify the logical state of any of the NVM cells of the array 201, circuit 200 may use its electrical signal source (e.g. charge pump) to produce a word-line signal. According to the prior art, either the same word-line signal is applied to both the word-line of the NVM cells to be operated and to the word-lines of reference cells against which the NVM cells are compared, or a fixedly offset word-line signal is applied to either the word-line of the NVM cells to be operated or to the word-lines of global reference cell(s) against which the NVM cells may be compared. According to some embodiments of the present invention, either or both the array word-line and the reference cell word-line signals are adapted by an offset circuit 203, thereby enabling a dynamic offset by a selected offset value. An offset circuit 203 according to some embodiments of the present invention may either increase or decrease the voltage of the word-line signal provided by the circuit 200. The offset circuit 203 may provide, or apply, its output to either the NVM array 201 word-line, as exemplified in FIG. 6, or to the global reference cell(s) block 504 word-line, as exemplified in FIG. 5. In some embodiment offset table 202 may be adapted to choose to use (such as by using a pointer to point at) a specific reference cells set from a plurality of reference cells sets that were distinctively precharged during their manufacturing, as described and exemplified in FIG. 7 In some embodiments of the present invention, the offset circuit 203 may be integrated, affiliated or embedded or incorpoareted, into circuit 200, while in other embodiments offset circuit 203 may be a separate circuit from the decoder.

A sense amplifier 205 may receive an output current from both the NVM cell being operated and the output current of global reference cell(s) 204 against which the NVM cell is being compared. The sense amplifier 205 may provide an output to decoder 200 indicating thereby to circuit 200 whether the NVM cell, or the reference cell, is charged to a higher thresold voltage and hence conducts higher current. Based on the output of the sense amplifier 205 as the NVM cell is compared against several reference cells 204, circuit 200 may determine the logical state of the NVM cell being tested.

According to some embodiments of the present invention, an offset table circuit 202, which may include an offset table, may receive a signal from the decoder 200, identifying which NVM cell is being operated. In response to the decoder 200 signal, the offset table circuit 202 may then provide a signal to the offset circuit 203 indicating to offset circuit 203 what amount of word-line signal offset to perform. The segment offset table circuit 202 may be programmed (e.g., offset table compiled) during the manufacturing of the NVM array 201. According to some embodiments of the present invention, the segment offset table circuit 202 may be integrated into the decoder 200, while in other embodiments of the present invention the segment offset table circuit 202 is a separate circuit in communication with the decoder 200. As mentioned hereinbefore, a lowest reference voltage determined for each segment, segment-specific reference voltage levels, and/or offset values between global values and/or local values, which are associated with specific respective logical states of a specific array segment, may be stored in segment offset table 202 (being the "reference voltage table" mentioned hereinbefore) associated with the NVM array 201.

Figure 3:
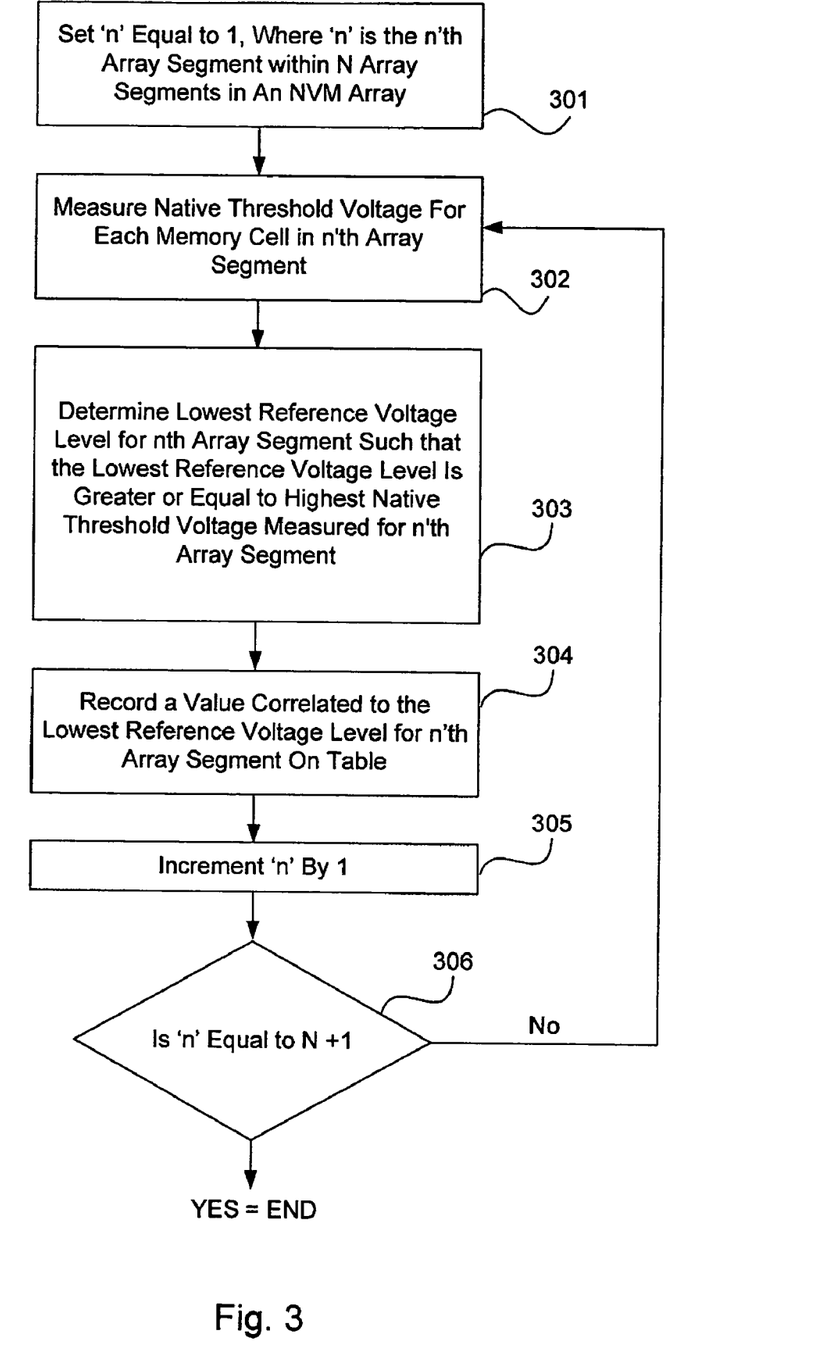
FIG. 3 is a flow chart illustrating a method by which the offset table circuit of FIG. 2 may be compiled for a given NVM array, in accordance with some embodiments of the present invnetion.

FIG. 3, to which reference is now made, shows a method by which the segment offset table circuit 202 of FIG. 2 may be compiled for a given NVM array 201, in accordance with some embodiments of the present invnetion. As part of step 301, a variable ('n') may be set to 1, where the constant N is equal to the number of segments in the NVM array 201 to be operated using the segment offset table circuit 202. During step 302, NVM cells in the n'th array segment of the array 201 may be tested or sampled to determine their native threshold voltage. As part of step 302, a lowest reference voltage level for the nth array segment may be determined, such that the lowest reference voltage level is greater or equal or lower to the highest native threshold voltage measured for the n'th array segment. Some value correlated to the lowest reference voltage level for the nth array segment may be stored in an entry or record of the segment offset table circuit 202 associated with n'th array segment (step 303). The (n) variable may be incremented by a value of 1 as part of step 304. During step 305, it may be determined whether (n) is not equal to N+1, and if not, steps 302 through 304 may be repeated.

Although FIG. 3 shows an example of a method by which offset values for NVM cells are determined and stored according to array segment, one of ordinary skill in the art should understand that NVM cells may be grouped in a variety of ways and that offset values associated with these cells may be stored and group accordingly. For example, it is possible to test the entire array 201 and group each cell individually into one of several groups, where each group is associated with a specific offset range from a given reference value. Group one could be associated with an offset of 0.1 to 0.2 Volts, group two with 0.2 to 0.3 Volts, and so on. One or more of the tables containing the groups of cells, for example the above discussed groups of cells defined by a common offset range, may be compiled and folded. Folding is well known in the logic design arts. The folded table or tables may be referenced or used by decoder 200 each time it attempts to operate an NVM cell, as described above. Any method of compiling, organizing, or otherwise using a lookup table, known today or to be devised in the future, is applicable to the present invention.

Figure 4:
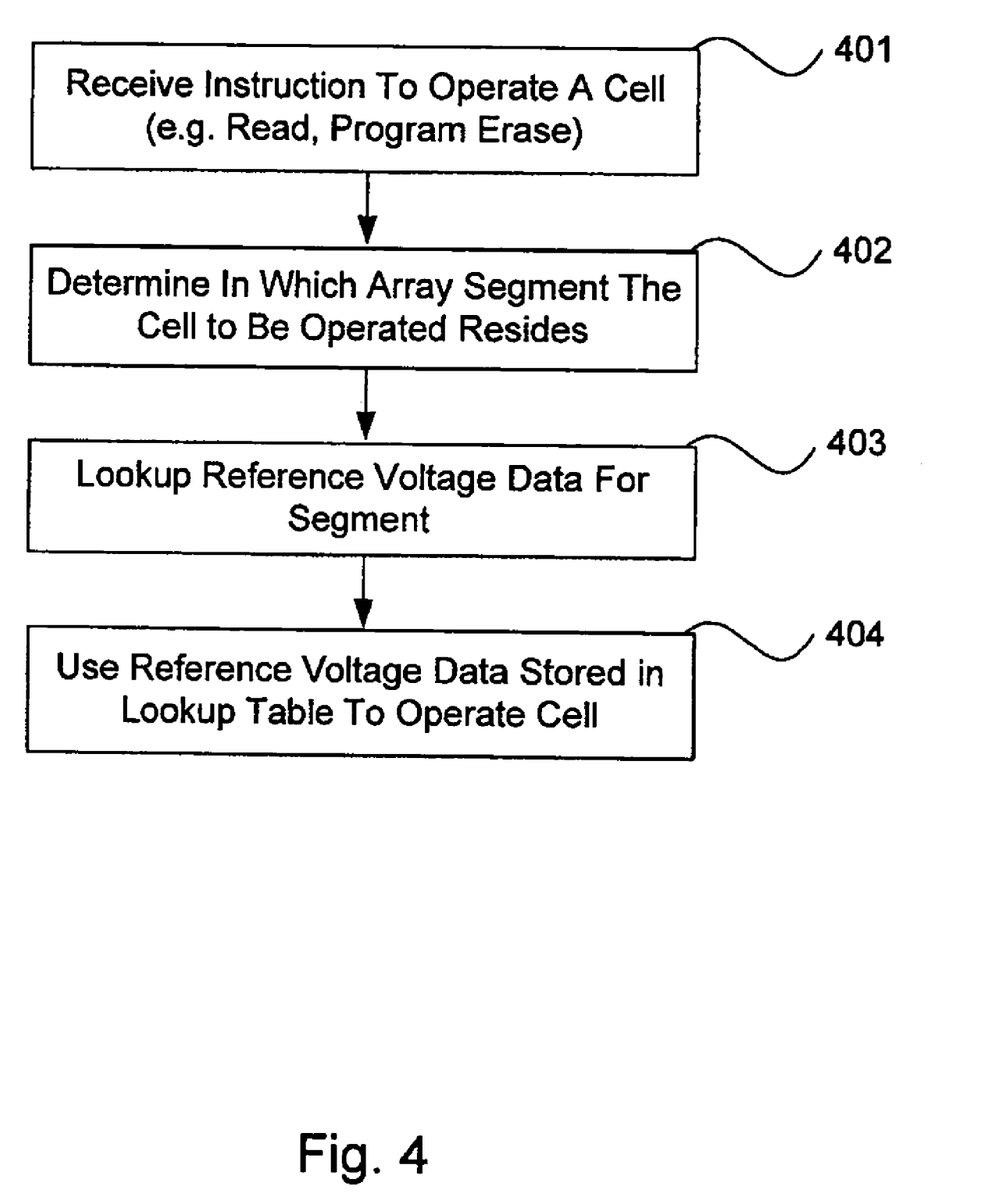
FIG. 4 is a block diagram depicting an example of a table according to some embodiments of the present invention.

Turning now to FIG. 4, there is shown a diagram depicting an exemplary way of operating a reference table, such as segment offset table 202 (FIG. 2) or segment offset table 502 (FIG. 5) according to some embodiments of the present invention. First, an instruction is received to operate a cell in the NVM array 201 (e.g., FIG. 2), at step 401. The instruction may be, "Read", "Program", or "Erase". As discussed hereinbefore, threshold values are applied per segment of the NVM array. Therefore, at step 402, a determination is reached, in which segment the cell to be operated resides. Then, at step 403, a reference voltage data is obtained from the lookup table (e.g., 202, FIG. 2), which pertains to the determined segment. Finally, at step 404, the reference voltage data is utilized to operate the cell.

Figure 5:
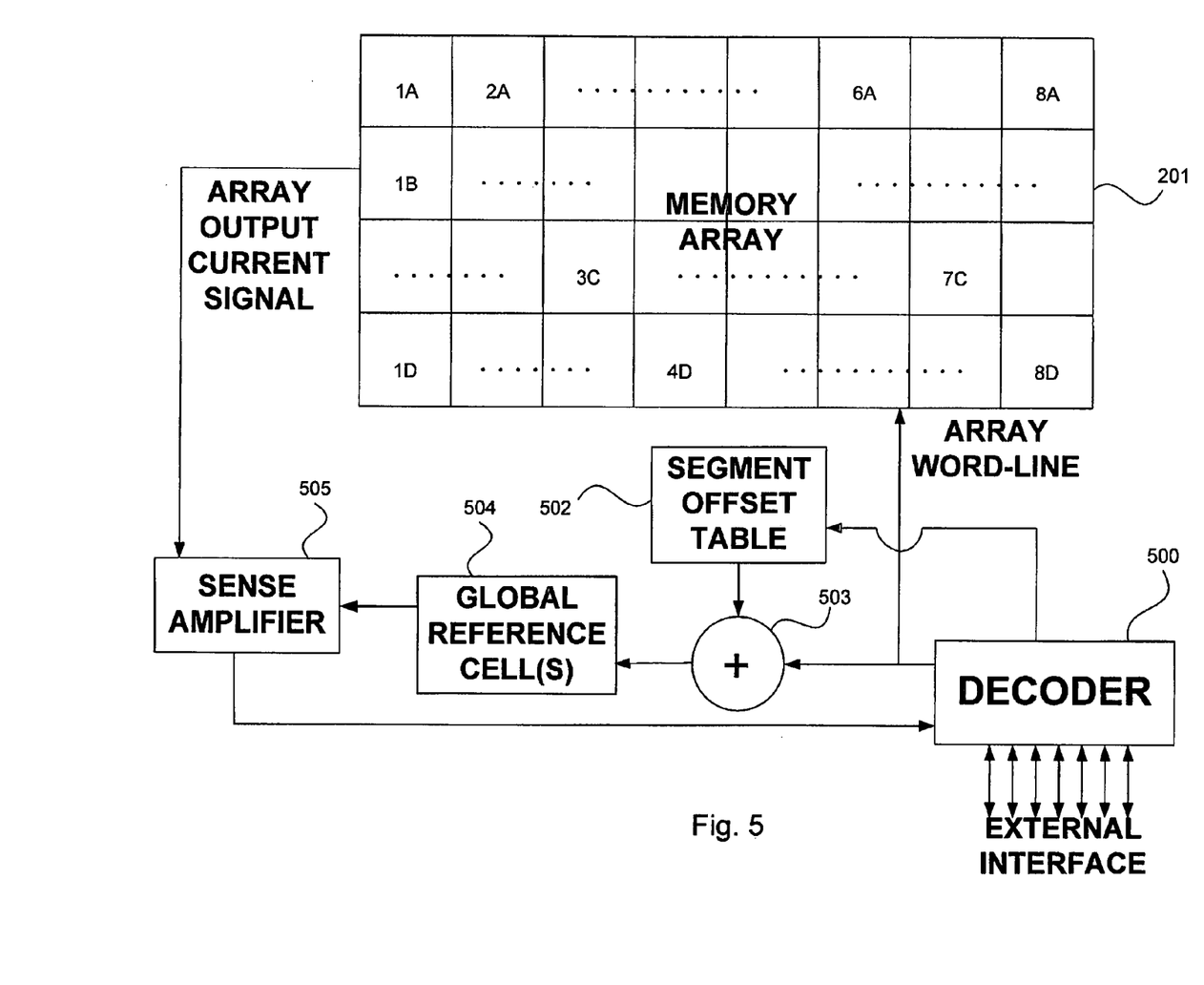
FIG. 5 is a block diagram illustration of another exemplary circuit for operating a NVM array, where an offset voltage/current is applied only to the reference cells, according to some embodiments of the present invention.
Figure 6:
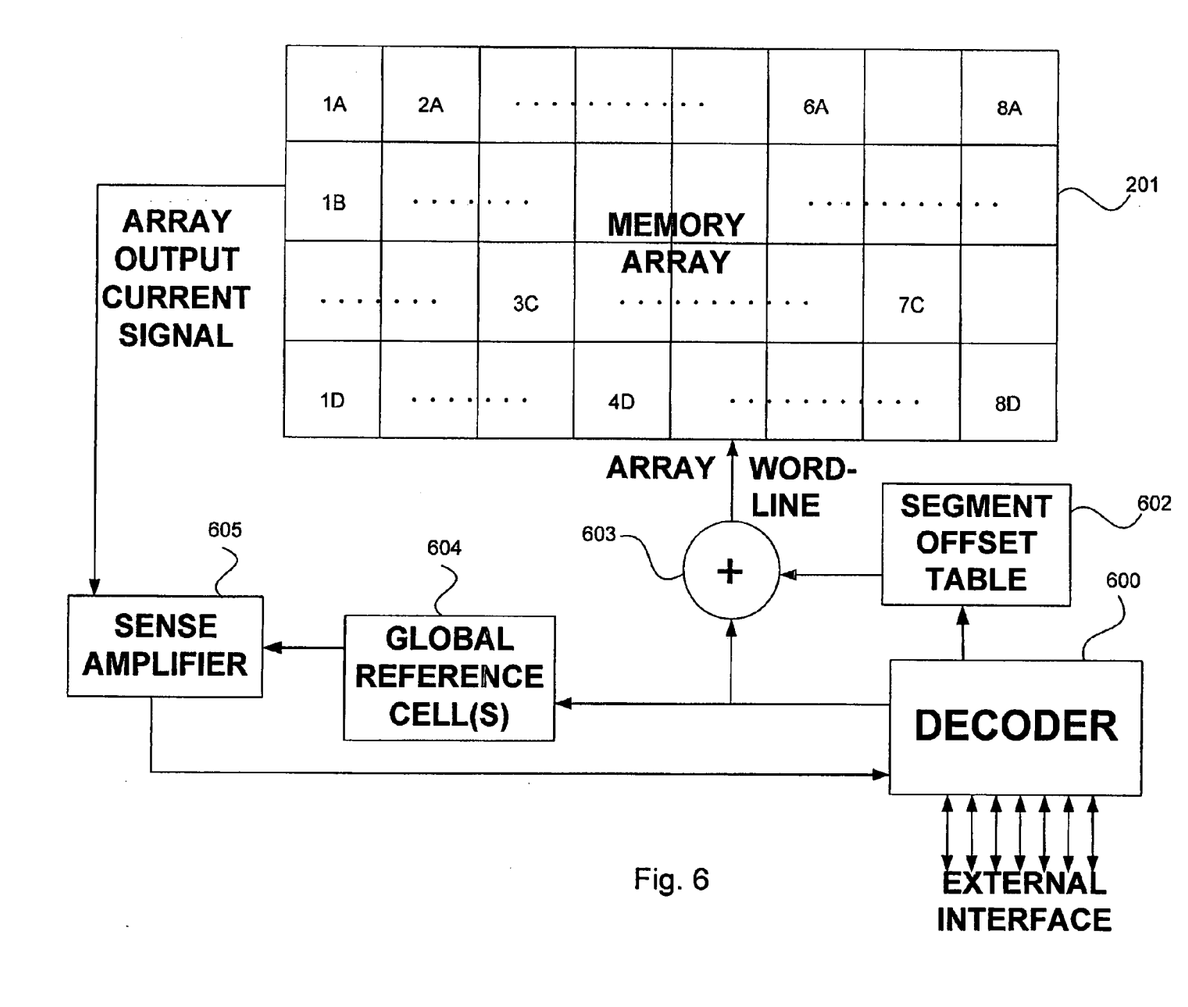
FIG. 6 is a block diagram illustration of another exemplary circuit for operating a NVM array, where an offset voltage/current is applied only to the NVM array, according to some embodiments of the present invention.
Figure 7:
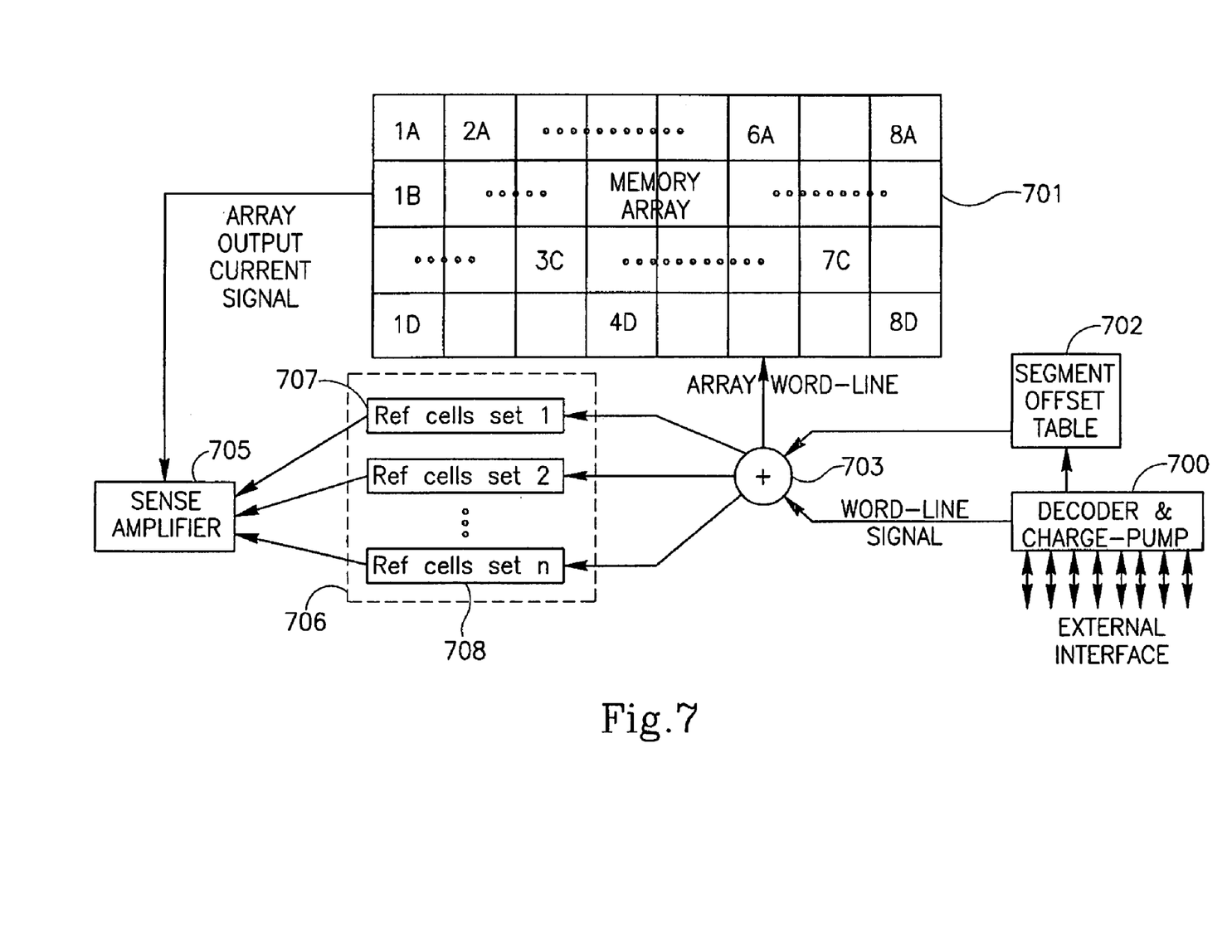
FIG. 7 is a block diagram illustration of another exemplary circuit for operating an NVM array, where an offset voltage/current is applied to the NVM array cells and to one set (out of few possible sets) of reference cells, according to some embodiments of the present invention.

The three exemplary circuits shown in FIGS. 5, 6 and 7 are alternative circuits to the circuit shown in FIG. 2. Referring now to FIG. 5, the offset voltage (or current) is generated and applied only to the global reference cell(s) 504, whereas the voltage (or current) of the cells of interest within NVM array 201, whose state is to be compared against reference cell(s) (504), is independent of the offset voltage (or current). Referring now to FIG. 6, the offset voltage (or current) is generated and applied only to the cells of interest within NVM array 201, whose state is to be compared against reference cell(s) (504), whereas to global reference cell(s) 604 is applied a voltage (or current) that is independent of any offset voltage (or current). Refering again to FIG. 7, the offset value may be obtained by selecting one reference cells set from several reference cells sets that are offsetted with respect to each other by precharging different reference cells sets to different (offsetted) voltage levels during their manufacturing.

Decoders 500, 600 and 700, segment offset tables 502, 602 and 702, offset circuits 503, 603 and 703, sense amplifiers 505, 605 and 705 function substantially in the same manner as decoder 200, segment offset table 202, offset circuit 203 and sense amplifier 205, respectively. Global reference cell(s) 504 and 604 function substantially in the same manner as, global reference cell(s) 204.

According to some embodiments of the present invention, global reference cells 706 may include multiple (n) sets of reference cells, designated 707 ("Ref cells set 1") to 708 ("Ref cells set n"). The n sets of reference cells may be devised based on different criterions, as described hereafter.

Accoridng to some aspects of this embodiment, the n sets of reference cells may be devised as "segment-oriented", which means that each set of the n sets of reference cells may be associated with, or dedicated to, a different segment of memory array 701. Namely, each specific set of the n sets of reference cells may provide the various voltage levels (program verify voltage level, read verify voltage level, etc.) required for operating each cell within the segment associated with the specific set. For example, reference cells constituting reference cells set 1 (707) may each relate to a different logical state (e.g., program verify voltage level, read verify voltage level, etc.) of a segment consisting of cells "1A" to "8A" in memory array 701). Reference cells constituting cells set n (708), on the other hand, may each relate to a different logical state (e.g., program verify voltage level for a given segment, read verify voltage level for a given segment, etc.) of a segment consisting of cells "1D" to "8D" in memory array 701. Put otherwise, if there are n segments and n reference cells sets, then reference cells set 1 (707) may provide signals "Read/Seg1", "Program/Seg1", etc. Likewise, reference cells set 2 may provide signals "Read/Seg2", "Program/Seg2", etc. Likewise, reference cells set 3 may provide signals "Read/Seg3", "Program/Seg3", and so on.

Accoridng to some other aspects of this embodiment, the n sets of reference cells may be "state-oriented", which means that each one of the n sets 707 to 708 may be associated with, or dedicated to, a different logical state of the array cells. For example, reference cells constituting cells set 1 (707) may be associated with a program verify voltage level, whereas reference cells constituting cells set n (708) may be associated, for example, with a read verify voltage level.

The reference cells constituting reference set 1 (707) may each be associated with a different segment. For example, if reference cells set 1 (707) is associated with a read verification voltage level, then a first reference cell within set 1 (707) may be associated with the read verification voltage level of a first segment of array 701 ("Read 1/Segment 1"), a second reference cell within set 1 (707) may be associated with the read verification voltage level of a second segment of array 701 ("Read 1/Segment 2"), and so on.

Likewise, if reference cells set n (708) is associated with a program verification voltage level, then a first reference cell within set n (708) may be associated with the program verification voltage level of a first segment of array 701 ("Program n/Segment 1"), a second reference cell within set n (708) may be associated with the program verification voltage level of a second segment of array 701 ("Program n/Segment 2"), and so on.

While a number of exemplary aspects and embodiments have been discussed above, those of skill in the art will recognize certain modifications, permutations, additions and sub-combinations thereof. It is therefore intended that the following appended claims, and claims hereafter introduced, be construed as including all such modifications, permutations, additions and sub-combinations as are within their true spirit and scope.

What is claimed:

1. A method of operating a memory cell in a memory array segment, said method comprising: determining a threshold offset value for said memory array segment by accessing a table offset values associated with said segment; and adjusting an input offset circuit of global reference cells by the threshold offset value defined for said memory cell.

2. The method according to claim 1, wherein a reference cell is selected from the global reference cells based on an offset value defined in the offset table for the memory cell.

3. The method according to claim 1, further comprising measuring an offset value for each of a set of memory array segments.

4. The method according to claim 2, further comprising programming said offset table with the measured offset values.

5. The method according to claim 1, wherein the step of adjusting an offset circuit comprises forwarding to the offset circuit a signal correlated with on offset value.

6. The method according to claim 1, wherein the global reference cells comprise multiple sets of reference cells.

7. The method according to claim 6, wherein each set of the multiple sets of reference cells is used for operating a different memory array segment.

8. The method according to claim 6, wherein each set of the multiple sets of reference cells is used far operating a different state of memory array segments.

9. A method of operating a memory cell in a memory array, comprising: determining a threshold offset value based on a location of said memory cell and on the operation to be performed and by accessing a table offset values associated with said segment; adjusting an input offset circuit of global reference cells by the threshold offset value for said memory cell; and operating said cell by using the global reference cells whose input offset circuit has been adjusted.

10. The method according to claim 9, wherein the step of determining a threshold offset value is comprised of accessing a table of offset values for a set of memory array segments and looking up a threshold offset value associated with the memory segment in which said memory cell resides.

11. The method according to claim 9, further comprising measuring an offset value for each of a set of memory array segments.

12. The method according to claim 10, further comprising storing in said offset table data relating to the measured offset values.

13. The method according to claim 12, wherein storing comprises programming a non volatile segment of the memory array with the measured offset values.

14. The method according to claim 9, wherein the step of adjusting an offset circuit comprises forwarding to an offset circuit a signal correlated to an offset value.

15. A memory array circuit comprising: an offset table comprising at least two offset values, wherein each offset value is associated with at least one memory segment in said memory array and is determined by accessing a table of offset values associated with said segment; and an adjustable reference cell circuit comprising global reference cells having a substantially fixed threshold and an input offset circuit to adjust by an offset value of a voltage applied to said global reference cells.

16. The memory array circuit according to claim 15, wherein the global reference cells comprise multiple sets of reference cells.

17. The memory array circuit according to claim 16, wherein each set of the multiple sets of reference cells is used for operating a different memory array segment.

18. The memory array circuit according to claim 16, wherein each set of the multiple sets of reference cells is used for operating a different state of memory array segments.

* * * * *

UNITED STATES PATENT AND TRADEMARK OFFICE
CERTIFICATE OF CORRECTION

PATENT NO. : 7,352,627 B2  
APPLICATION NO. : 11/324718  
DATED : April 1, 2008  
INVENTOR(S) : Guy Cohen It is certified that error appears in the above-identified patent and that said Letters Patent is hereby corrected as shown below:

On title page  
Item [73] Assignee. The Assignee should read "SAIFUN SEMICONDUCTORS LTD."

Signed and Sealed this

Twenty-second Day of December, 2009

David J. Kappos  
*Director of the United States Patent and Trademark Office*